United States Patent [19]

Kamase

[11] Patent Number: 5,187,391
[45] Date of Patent: Feb. 16, 1993

[54] MODIFIED NON-THRESHOLD LOGIC CIRCUIT

[75] Inventor: Fumihiro Kamase, Tokyo, Japan

[73] Assignee: NEC Corporation, Tokyo, Japan

[21] Appl. No.: 723,921

[22] Filed: Jul. 1, 1991

[30] Foreign Application Priority Data

Jun. 29, 1990 [JP] Japan .................. 2-173945

[51] Int. Cl.⁵ ........................................ H03K 19/013
[52] U.S. Cl. ................................. 307/454; 307/467
[58] Field of Search .............. 307/454, 455, 466, 467, 307/443

[56] References Cited

U.S. PATENT DOCUMENTS

| | | | |
|---|---|---|---|
| 4,687,953 | 8/1987 | Varadarajan | 307/454 |
| 4,695,749 | 9/1987 | Lam | 307/454 |
| 4,835,420 | 5/1989 | Rosky | 307/454 |
| 4,948,991 | 8/1990 | Schucker | 307/467 |
| 5,027,013 | 6/1991 | Coy | 307/455 |
| 5,073,728 | 12/1991 | Ovens | 307/467 |

*Primary Examiner*—Eugene R. LaRoche
*Assistant Examiner*—A. Zarabian

[57] ABSTRACT

A modified non-threshold logic (MNTL) circuit includes an MNTL basic gate circuit and an emitter follower circuit. In the emitter follower circuit, a base of a pull down transistor of the emitter follower circuit which composes a push pull circuitry structure is biased by a clamping transistor and a high resistance resistor, and connected to either an OR output or an input voltage terminal of the MNTL basic gate circuit. In this structure, the pull down transistor becomes ON state with a high impulse response when the OR output or the input voltage terminal becomes high level, so that a propagation delay time of an output signal of the emitter follower circuit is shortened significantly.

3 Claims, 4 Drawing Sheets

MODIFIED NON-THRESHOLD LOGIC CIRCUIT

FIELD OF THE INVENTION

This invention relates to a modified nonthreshold logic (MNTL) circuit, and more particularly to, an MNTL circuit including a monolithic basic gate circuit and an emitter follower circuit which drives a wiring load capacitor.

BACKGROUND OF THE INVENTION

A conventional MNTL circuit includes an MNTL basic gate circuit and an emitter follower circuit. In the emitter follower circuit, a driving transistor which is driven by the MNTL basic gate circuit supplies an output level to an output terminal thereof.

In operation, when the driving transistor becomes ON state, an output signal of the emitter follower circuit becomes high level to charge up a wiring stray capacitance existing between the output terminal and a lower power supply level. When the driving transistor becomes OFF state, charges accumulated in the wiring stray capacitance are discharged toward the lower supply level through a resistor, and the output signal of the emitter follower circuit becomes low level.

According to the conventional MNTL circuit, however, there is a disadvantage in that a propagation delay time of the output signal thereof is relatively long, because a fall time of the output signal is long as compared with a building-up (rise) time thereof. The fall time of the output signal is dependent on a discharging time of the charges accumulated in the wiring stray capacitance through the resistor.

SUMMARY OF THE INVENTION

Accordingly, it is an object of the invention to provide an MNTL circuit in which a propagation delay time of an output signal thereof is shortened.

According to a feature of the invention, an MNTL circuit comprises:

an MNTL basic gate circuit comprising first to third transistors, the first and second transistors becoming ON state selectively in an alternative way, the first transistor being controlled by an input voltage applied to a base of the first transistor, the second transistor being controlled by a reference voltage applied to a base of the second transistor, and the third transistor being controlled by a constant current supply voltage applied to a base of the third transistor to flow a constant current through the third transistor; and an emitter follower circuit comprising driving, pull down and clamping transistors, a bias resistor and a coupling capacitor, the driving transistor being controlled by a collector output of the first transistor of the MNTL basic gate circuit applied to a base of the driving transistor, and the pull down transistor being biased at a base by the clamping transistor and the bias resistor having a high resistivity and being controlled by the MNTL circuit.

BRIEF DESCRIPTION OF THE DRAWINGS

The invention will be explained in more detail in conjunction with appended drawings wherein.

DESCRIPTION OF THE PREFERRED EMBODIMENTS

Figure 1:
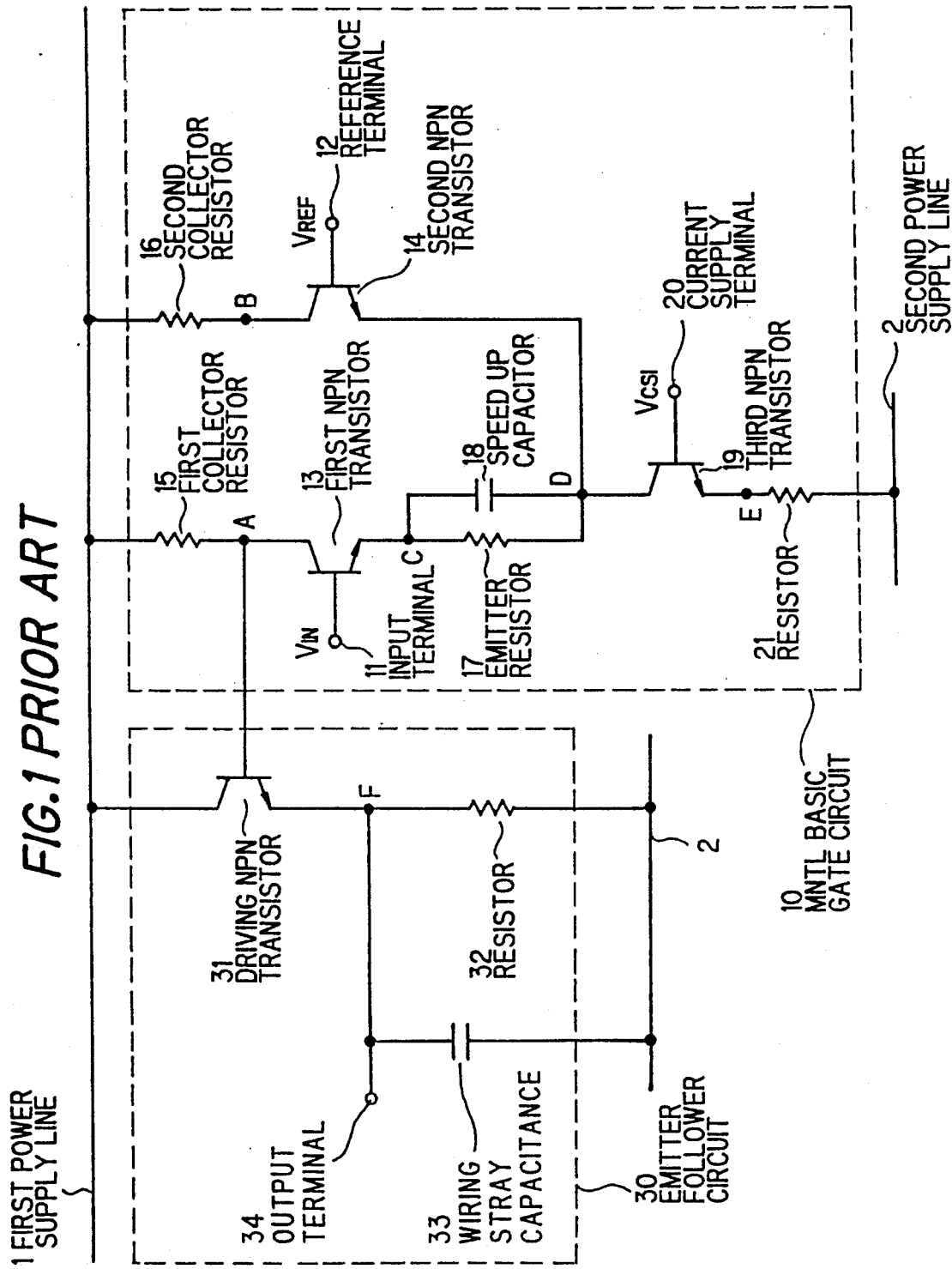
FIG. 1 is a circuitry diagram of a conventional MNTL circuit.

Before describing an MNTL circuit in preferred embodiments according to the invention, the conventional MNTL circuit described before will be explained in conjunction with FIG. 1.

The conventional MNTL circuit includes an MNTL basic gate circuit 10 and an emitter follower circuit 30.

The MNTL basic gate circuit 10 includes first to third NPN transistors 13, 14 and 19, first and second collector resistors 15 and 16, an emitter resistor 17 and a resistor 21, and a capacitor 18. The first NPN transistor 13 is connected at a base to an input terminal 11 to which an input voltage $V_{IN}$ is applied, at a collector to a nodal point A, and at an emitter to a nodal point C. The second NPN transistor 14 is connected at a base to a reference terminal 12 to which a reference voltage $V_{REF}$ is applied, at a collector to a nodal point B, and at an emitter to a nodal point D. The third NPN transistor 19 is connected at a base to a current supply terminal 20 to which a constant current supply voltage $V_{CSI}$ is applied by which a constant current flows through the third NPN transistor 19, at a collector to the nodal point D, and at an emitter to a nodal point E. The first collector resistor 15 is connected at a first terminal to a first power supply line 1 from which a first power supply voltage $V_{CC}$ (which is normally a ground level GND) is applied, and at a second terminal to the nodal point A. The second collector resistor 16 is connected at a first terminal to the first power supply line 1 and at a second terminal to the nodal point B. The emitter resistor 17 is connected at a first terminal to the nodal point C and at a second terminal to the nodal point D.

The resistor 21 is connected at a first terminal to the nodal point E and at a second terminal to a second power supply line 2 from which a second power supply voltage $V_{EE}$ (which is normally a level lower than the ground level GND) is applied. The speed up capacitor 18 is connected at a first terminal to the nodal point C and at a second terminal to the nodal point D.

The emitter follower circuit 30 includes a driving transistor 31, a resistor 32. The driving transistor 31 is connected at a base to the nodal point A of the MNTL basic gate circuit 10, at a collector to the first power supply line 1, and at an emitter to a nodal point F which is connected to an output terminal 34. The resistor 32 is connected at a first terminal to the nodal point F and at a second terminal to the second power supply line 2. There exists a wiring stray capacitance 33 between output terminal 34 and the second power supply line 2.

In this conventional MNTL circuit, the wiring stray capacitance 33 is shown to be positioned between the output terminal 34 and the second power supply line 2, because a potential of an IC substrate for incorporating the MNTL circuit is equal to that of the second power supply line 2, so that the wiring stray capacitance 33 is more dominant than a stray capacitance generated between the output terminal 34 and the first power supply line 1.

In operation, the first and second transistors 13 and 14 become ON state selectively in an alternative way. When the input voltage $V_{IN}$ of a low level is applied to the base of the first transistor 13 through the input terminal 11 to make the first transistor 13 OFF state, no current flows through the first collector resistor 15 and no voltage drop occurs, so that the nodal point A becomes the same level as the first power supply line 1 having a high level $V_{CC}$. Accordingly, the base of the driving transistor 31 of the emitter follower circuit 30 is applied with the high level $V_{CC}$ to make the driving transistor 31 ON state, so that an output level of the emitter of the driving transistor 31 as an output signal of the emitter follower circuit 30 becomes high level and the wiring stray capacitance 33 is charged up.

When the input voltage $V_{IN}$ of a high level is applied to the base of the first transistor 13 to make the first transistor 13 ON state, a current flows through the first collector resistor 15 from the first power supply line 1 to the first transistor 13 and a voltage drop occurs, so that the nodal point A becomes low level. Accordingly, the base of the driving transistor 31 is applied with the low level to make the driving transistor 31 OFF state, so that charges accumulated in the wiring stray capacitance 33 are discharged toward the second power supply line 2 through the resistor 32 and the output signal of the emitter follower circuit 30 becomes low level.

Such a conventional MNTL circuit is described in "A Monolithic 8pJ/2 GHZ Logic Family", IEEE Journal of Solid-State Circuits, vol. SC-10, NO. 10, Dec. 1975.

Next, an MNTL circuit in a first preferred embodiment will be described in conjunction with FIG. 2, wherein like parts are indicated like reference numerals as used in FIG. 1.

The MNTL circuit includes an MNTL basic gate circuit 10 and an emitter follower circuit 40. The MNTL basic gate circuit 10 has the same circuitry structure as shown in FIG. 1, so that the description thereof will be omitted. First and second power supply lines 1 and 2 are also the same as those in FIG. 1.

The emitter follower circuit 40 includes driving, pull down and clamping transistors 41, 42 and 43, a resistor 47, and a bias capacitor 46. The driving transistor 41 is connected at a base to a nodal point A of the MNTL basic gate circuit 10, at a collector to the first power supply line 1, and at an emitter to a nodal point F which is connected to an output terminal 48. The clamping transistor 42 is connected at a base to a clamp terminal 45 to which a clamp voltage $V_{CLP}$ is applied, at a collector to the first power supply line 1, and at an emitter to a nodal point G. The pull down transistor 43 which composes a push pull circuitry structure is connected at a base to the nodal point G, at a collector to the nodal point F, and at an emitter to the second power supply line 2. The bias resistor 47 which has a high resistance is connected at a first terminal to the nodal point G and at a second terminal to the second power supply line 2. There exists a wiring stray capacitance 44 between the output terminal 48 and the second power supply line 2. The coupling capacitor 46 is connected at a first terminal to the nodal point G and at a second terminal to a nodal point B (OR output) of the MNTL basic gate circuit 10.

In operation, when the input voltage $V_{IN}$ of a low level is applied to the base of the first transistor 13 of the MNTL basic gate circuit 10 through the input terminal 11 to make the first transistor 13 OFF state, the nodal point A becomes high level $V_{cc}$. Accordingly, the base of the driving transistor 41 of the emitter follower circuit 40 is applied with the high level $V_{cc}$ to make the driving transistor 41 ON state, so that an output signal of the emitter follower circuit 40 becomes high level and the wiring stray capacitance 44 is charged up. Such an operation is the same as that in FIG. 1.

When the input voltage $V_{IN}$ of a high level is applied to the base of the first transistor 13 to make the first transistor 13 ON state, the nodal point A becomes a low level, so that the base of the driving transistor 41 is applied with the low level to make the driving transistor 41 OFF state. Charges accumulated in the wiring stray capacitance 44 are discharged toward the second power supply line 2 through the pull down transistor 43 and the output signal of the emitter follower circuit 40 becomes low level.

In this MNTL circuit, a voltage $V_{BE}$ between the base and emitter of the pull down transistor 43 is biased regularly by the clamping transistor 42 and the bias resistor 47 to improve an impulse response thereof. If the first transistor 13 becomes ON state to make the driving transistor 41 OFF state, the second transistor 14 becomes OFF state to make the nodal point B (OR output) high level, because the first and second transistors 13 and 14 become ON state in an alternative way. In this state, a current flows from the nodal point B to the base of the pull down transistor 43 through the coupling capacitor 46 to increase a potential level of the base of the pull down transistor 43. Accordingly, the pull down transistor 43 becomes ON state with a high impulse response, so that the charges in the wiring stray capacitance 44 are discharged quickly through the pull down transistor 43. As a result, a fall time of the output signal of the emitter follower circuit 40 becomes short, therefore a propagation delay time of the output signal thereof becomes short.

Next, an MNTL circuit in a second preferred embodiment will be described in conjunction with FIG. 3, wherein like parts are indicated like reference numerals as used in FIG. 2. The MNTL circuit has the same circuitry structure as that in FIG. 2, except that a coupling capacitor 46 is connected at a second terminal to an input terminal 11 of an MNTL basic gate circuit 10.

Figure 2:
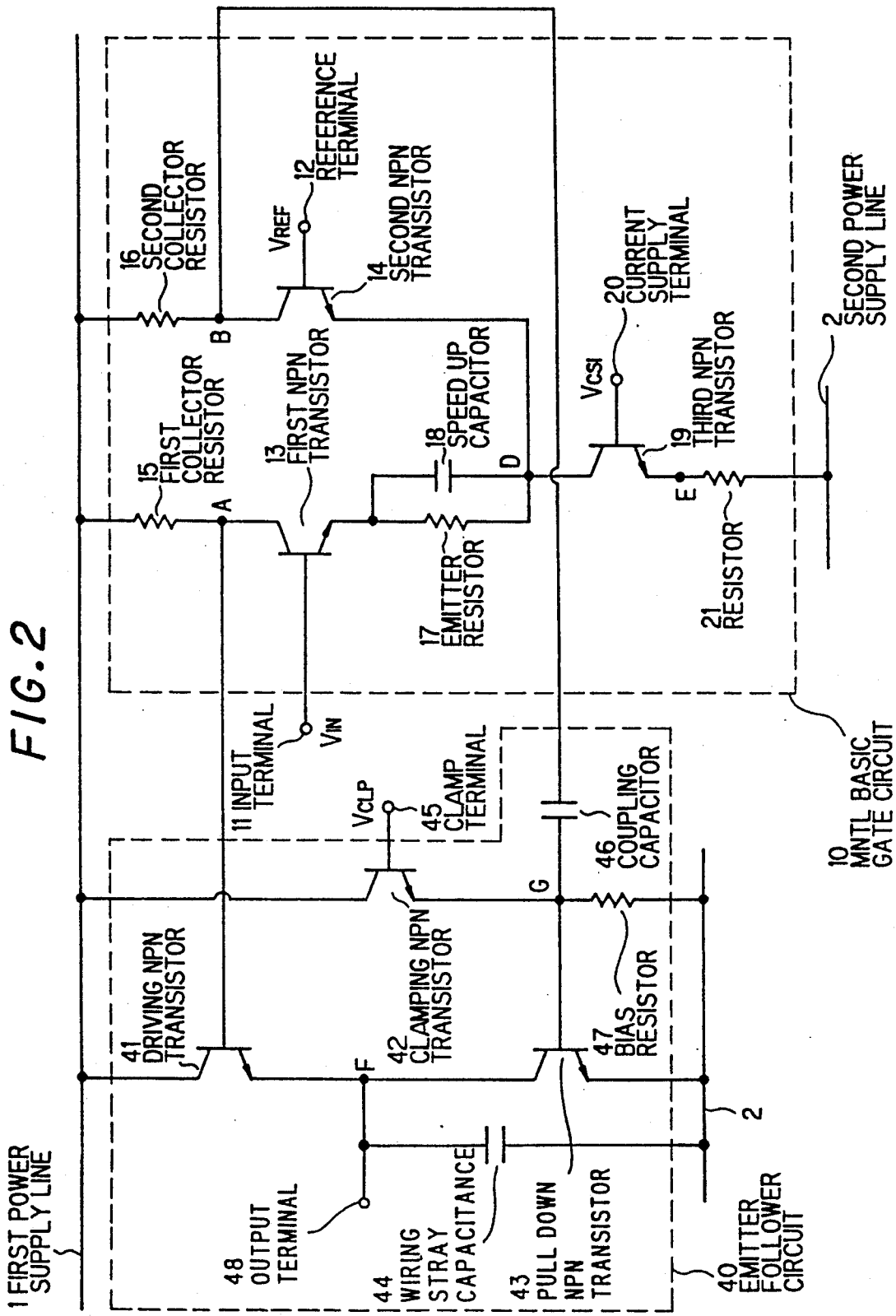
FIG. 2 is a circuitry diagram of an MNTL circuit in a first preferred embodiment according to the invention.
Figure 3:
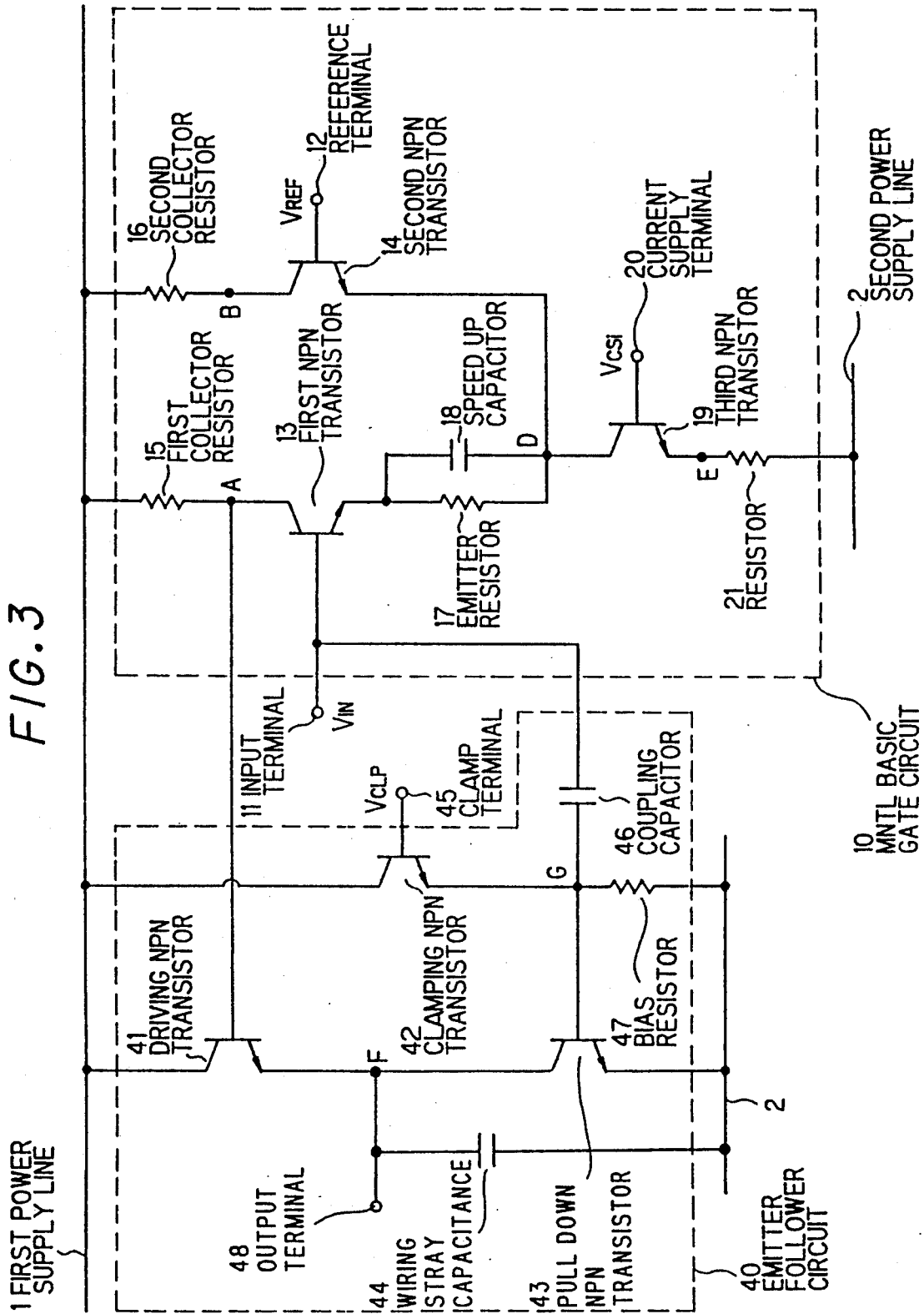
FIG. 3 is a circuitry diagram of an MNTL circuit in a second preferred embodiment according to the invention.

In this MNTL circuit, a current flows from the input terminal 11 to the base of the pull down transistor 43 through the coupling capacitor 46 to increase a potential level of the base of the pull down transistor 43 when the driving transistor 41 becomes OFF state as like in FIG. 2, because the level of the input terminal 11 has the same phase as that of the nodal point B (OR output). Accordingly, the pull down transistor 43 becomes ON state with a high impulse response to shorten a fall time of the output signal of the emitter follower circuit 40 as like in FIG. 2. Furthermore, the MNTL circuit in this preferred embodiment has an advantage in that the pull down transistor 43 becomes ON state with a higher impulse response as compared with that in the first preferred embodiment, because the input voltage $V_{cc}$ applied to the input terminal 11 changes faster by the delay time than the level of the nodal point B (OR output), though the input voltage $V_{cc}$ has the same phase as that of the level of the nodal point B. Therefore, the emitter follower circuit 40 in the second preferred embodiment drives a load in a higher speed as compared with that in the first preferred embodiment.

Figure 4:
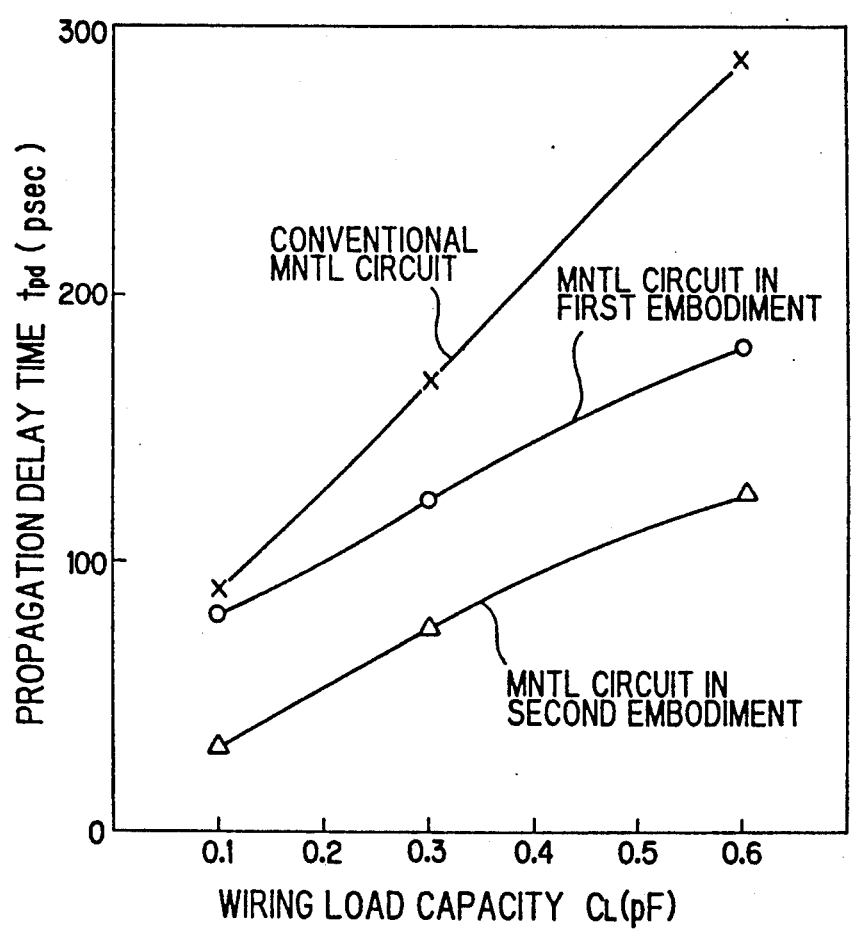
FIG. 4 is a graph showing a relation between a propagation delay time and a wiring stray capacitance in the MNTL circuit in the preferred embodiments as well as the conventional MNTL circuit.

FIG. 4 is a graph showing a relation between a propagation delay time $t_{pd}$ and a wiring stray capacitance $C_L$ of the MNTL circuit in the preferred embodiments as well as the conventional MNTL circuit calculated by simulation. In the first preferred embodiment, the propagation delay time $t_{pd}$ is shortened by 8.5%, 26.4% and 37.3% as compared with those in the conventional MNTL circuit, when the wiring stray capacitance $C_L$ is approximately 0.1 pF, 0.3 pF and 0.6 pF, respectively. In the second preferred embodiment, the propagation delay time $t_{pd}$ is shortened by 64.2%, 55.4% and 56.7%, when the wiring stray capacitance $C_L$ is approximately 0.1 pF, 0.3 pF and 0.6 pF, respectively.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A modified non-threshold logic (MNTL) circuit comprising:
   an MNTL basic gate circuit connected between a first and second power supply line and comprising first, second and third transistors, said first and second transistors becoming ON state selectively in an alternative way, said first transistor being connected to an input terminal and controlled by an input voltage applied to a base of said first transistor therefrom, said second transistor being connected to a reference terminal and controlled by a reference voltage applied to a base of said second transistor therefrom, and said third transistor being connected to a constant current supply terminal and controlled by a constant current supply voltage applied to a base of said third transistor therefrom to flow a constant current through said third transistor, an emitter resistor interconnected between an emitter of said first transistor and a collector of said third transistor, and a speed up capacitor connected in parallel to said emitter resistor between said emitter of said first transistor and said collector of said third transistor; and
   an emitter follower circuit comprising a driving transistor having a base connected to a collector of said first transistor and a collector connected to the first power supply line, a pull down transistor connected at a collector thereof to an emitter of said driving transistor, a clamping transistor connected to a base of said pull down transistor, a bias resistor connected at one end thereof to the base of said pull down transistor and at another end thereof to the second power supply line, and a coupling capacitor connected between said one end of said bias resistor and one of said first and second transistor, said driving transistor being controlled by a collector output of said first transistor of said MNTL basic gate circuit applied to the base of said driving transistor, said pull down transistor being biased at the base thereof by said clamping transistor and said bias resistor having a high resistance and being controlled by the MNTL basic gate circuit.

2. An MNTL circuit according to claim 1 wherein said pull down transistor is connected at the base thereof to a point selected from a first point connected with a collector of said second transistor of said MNTL basic gate circuit and a second point connected with said input terminal.

3. A modified non-threshold logic (MNTL) circuit comprising:
   an MNTL basic gate circuit connected between a first and second power supply line and comprising first, second and third transistors, said first and second transistors becoming ON state selectively in an alternative way, said first transistor being connected to an input terminal and controlled by an input voltage applied to a base of said first transistor therefrom, said second transistor being connected to a reference terminal and controlled by a reference voltage applied to a base of said second transistor therefrom, and said third transistor being connected to a constant current supply terminal and controlled by a constant current supply voltage applied to a base of said third transistor therefrom to flow a constant current through said third transistor, an emitter resistor interconnected between an emitter of said first transistor and a collector of said third transistor, and a speed up capacitor connected in parallel to said emitter resistor between said emitter of said first transistor and said collector of said third transistor; and
   an emitter follower circuit comprising a driving transistor having a base connected to a collector of said first transistor and a collector connected to the first power supply line, a pull down transistor having a collector connected to an emitter of said driving transistor, a clamping transistor connected to a base of said pull down transistor, a bias resistor connected at one end thereof to the base of said pull down transistor and at another end thereof to the second power supply line, and a coupling capacitor connected at one side thereof to said one end of said bias resistor and at another side thereof to a connection point with a collector of said second transistor, said driving transistor being controlled by a collector output of said first transistor of said MNTL basic gate circuit applied to the base of said driving transistor, said pull down transistor being biased at the base thereof by said clamping transistor and said bias resistor having a high resistance and being controlled by said MNTL basic gate circuit.

* * * * *